(12) United States Patent
Zhu

(10) Patent No.: US 8,564,027 B2
(45) Date of Patent: Oct. 22, 2013

(54) NANO-DEVICES FORMED WITH SUSPENDED GRAPHENE MEMBRANE

(75) Inventor: Wenjuan Zhu, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/359,647

(22) Filed: Jan. 27, 2012

(65) Prior Publication Data
US 2013/0193410 A1 Aug. 1, 2013

(51) Int. Cl.
*H01L 29/84* (2006.01)
(52) U.S. Cl.
USPC ............... 257/254; 257/252; 257/E27.085; 977/734; 365/157
(58) Field of Classification Search
USPC ............. 438/52, 53, 269; 257/215, 252, 257/E27.084, E27.098, E27.102, 254, 257/E27.085; 977/734; 365/157
See application file for complete search history.

(56) References Cited

U.S. PATENT DOCUMENTS

| | | | |
|---|---|---|---|
| 6,468,877 B1 | 10/2002 | Pradeep et al. | |
| 7,105,382 B2* | 9/2006 | Myers et al. | 438/122 |
| 7,138,627 B1 | 11/2006 | Nakayama et al. | |
| 7,687,308 B2 | 3/2010 | Parikh et al. | |
| 7,782,652 B2* | 8/2010 | Bertin et al. | 365/151 |
| 2006/0223267 A1* | 10/2006 | Machill et al. | 438/288 |
| 2009/0201743 A1 | 8/2009 | Yang | |
| 2010/0012925 A1 | 1/2010 | Bertin et al. | |
| 2010/0025660 A1 | 2/2010 | Jain et al. | |
| 2011/0000703 A1 | 1/2011 | Nakayama et al. | |
| 2012/0053580 A1* | 3/2012 | Sretavan | 606/41 |

OTHER PUBLICATIONS

J.S. Moon et al., "Top-Gated Graphene Field-Effect Transistors Using Graphene on Si (111) Wafers," IEEE Electron Device Letters, Nov. 2010, pp. 1193-1195, vol. 31, No. 11.

* cited by examiner

*Primary Examiner* — Jarrett Stark
*Assistant Examiner* — Shahed Ahmed
(74) *Attorney, Agent, or Firm* — Vazken Alexanian; Ryan, Mason & Lewis, LLP

(57) ABSTRACT

Semiconductor nano-devices, such as nano-probe and nano-knife devices, which are constructed using graphene films that are suspended between open cavities of a semiconductor structure. The suspended graphene films serve as electro-mechanical membranes that can be made very thin, from one or few atoms in thickness, to greatly improve the sensitivity and reliability of semiconductor nano-probe and nano-knife devices.

10 Claims, 9 Drawing Sheets

100

US 8,564,027 B2

NANO-DEVICES FORMED WITH SUSPENDED GRAPHENE MEMBRANE

TECHNICAL FIELD

The field relates generally to semiconductor nano-devices and in particular, semiconductor nano-probe and nano-knife devices that are constructed by mounting nano-probes or nano-knives on suspended graphene membranes.

BACKGROUND

Nano-probe and nano-knives are very useful for applications such as medical diagnosis and surgery, scientific experiments and use as industrial sensors. Typically, nano-probes/knives are mounted on an electro-mechanical membrane. The electro-mechanical membrane for these devices is typically made from thin metal films or etched silicon layers. To enhance the sensitivity of the device, the electro-mechanical membrane must be made as thin as possible, which is problematic from a structural standpoint as electro-mechanical membranes formed of metal films and silicon become very brittle as they are made thinner.

SUMMARY

Aspects of the invention include semiconductor nano-devices, such as nano-probe and nano-knife devices, which are constructed using suspended graphene films. The suspended graphene films serve as electro-mechanical membranes that can be made very thin, from one or few atoms in thickness, to greatly improve the sensitivity and reliability of semiconductor nano-probe and nano-knife devices that are constructed according to principles of the invention.

In one aspect of the invention, a semiconductor device includes a bottom gate electrode and a first insulating layer disposed over the bottom gate electrode. The first insulating layer includes a first open cavity aligned with the bottom gate electrode. A second insulating layer is disposed over the first insulating layer. The second insulating layer includes a second open cavity aligned with the first open cavity. A graphene layer is disposed between the first and second insulating layers, wherein a portion of the graphene layer is suspended between the first and second open cavities. At least one sense electrode is disposed on the graphene layer adjacent the first and second open cavities. An elongated nano-structure is mounted to the portion of the graphene layer that is suspended between the first and second open cavities. A top gate electrode is disposed over the second insulating layer. The top gate electrode is aligned with the bottom gate electrode and the first and second open cavities. The elongated nano-structure may be a nano-knife structure or a nano-probe structure.

In another aspect of the invention, a method of forming a semiconductor device includes forming a bottom gate electrode in a substrate, forming a first insulating layer over the substrate covering the bottom gate electrode, etching a first cavity in the first insulating layer, wherein the first cavity is aligned with the bottom gate electrode, filling the first cavity with a second layer of insulating material, planarizing the second layer of insulating material using the first insluting layer as an etch stop to form a first planarized surface, forming a graphene layer on the first planarized surface, forming one or more sense electrodes on the graphene layer, wherein the one or more sense electrodes are disposed on the graphene layer adjacent to the first cavity, forming a third insulating layer over the graphene layer and covering the one or more sense electrodes, etching a second cavity in the third insulating layer, wherein the second cavity is aligned with the first cavity, filling the second cavity with a fourth layer of insulating material, planarizing the fourth layer of insulating material stopping on the third insluting layer to form a second planarized surface, forming a fifth insulating layer over the second planarized surface, forming a top gate electrode over the fifth insulating layer, the top gate electrode aligned with the first and second cavities, dicing the substrate to form an individual semiconductor nano-structure, removing the second and fourth layers of insulating material from the first and second cavities, respectively, to form first and second open cavities, and mounting an elongated nano-structure to a portion of the graphene layer that is suspended between the first and second open cavities.

In yet another aspect of the invention, a method of forming a semiconductor device includes forming a bottom gate electrode, forming a first insulating layer over the bottom gate electrode, the first insulating layer comprising a first open cavity aligned with the bottom gate electrode, forming a graphene layer over the first insulating layer, forming one or more sense electrodes on the graphene layer, forming a second insulating layer over the graphene layer, the second insulating layer comprising a second open cavity aligned with the first cavity, forming a top gate electrode over the second insulating layer, wherein the top gate electrode is aligned with the first and second open cavities, and mounting an elongated nano-structure to a portion of the graphene layer that is suspended between the first and second open cavities.

These and other aspects, features and embodiments of the present invention will become apparent from the following detailed description of preferred embodiments, which is to be read in conjunction with the accompanying figures.

BRIEF DESCRIPTION OF THE DRAWINGS

FIGS. 2A, 2B, 2C, 2D, 2E, 2F, 2G, 2H, 2I, 2J, 2K, 2L, 2M, 2N, 2O and 2P schematically illustrate a method for constructing a semiconductor nano-device at various stages of fabrication, according to an aspect of the invention, wherein:

FIG. 2A is a cross-sectional view of a semiconductor nano-device device at an initial stage of fabrication after doping a region of a semiconductor substrate to form a first gate electrode, FIG. 2B is a cross-sectional view of the structure of FIG. 2A after forming a first insulating layer over the substrate and forming an etch mask on the first insluting layer, FIG. 2C is a cross-sectional view of the structure of FIG. 2B after etching a cavity in the first insulating layer using the etch mask, FIG. 2D is a cross-sectional view of the structure of FIG. 2C after depositing a second layer of insluting material to fill the cavity, FIG. 2E is a cross-sectional view of the structure of FIG. 2D after planarizing the structure down to the first layer of insulating material, FIG. 2F is a cross sectional view of the structure of FIG. 2E after depositing a graphene membrane on the planarized surface, FIG. 2G is a cross-sectional view of the structure of FIG. 2F after forming sense electrodes on the graphene membrane, FIG. 2H is a cross-sectional view of the structure of FIG. 2G after forming a third layer of insulating material over the graphene membrane and sense electrodes, FIG. 2I is a cross-sectional view of the structure of FIG. 2H after etching a cavity in the third layer of insulating material, which is aligned with the underlying cavity formed in the first insulating layer, FIG. 2J is a cross-sectional view of the structure of FIG. 2I after depositing a fourth layer of insulating material to fill the cavity formed in the third layer of insulating material, FIG. 2K is a cross-sectional view of the structure of FIG. 2J after planarizing the substrate surface down to the third layer of insulating material, FIG. 2L is a cross-sectional view of the structure of FIG. 2K after depositing a fifth layer of insulating material over the planarized surface, FIG. 2M is a cross-sectional view of the structure of FIG. 2L after forming a top gate electrode on top of the fifth layer of insulating material, which is aligned with the bottom gate electrode formed in the substrate, FIG. 2N is a cross-sectional view of the structure of FIG. 2M after etching portions of the fifth and third layers of insulating material to expose the sense electrodes on either side of the top gate electrode, FIG. 2O is a cross-sectional view of the structure of FIG. 2N after dicing the substrate to form an individual semiconductor nano-structure and removing the second layer of sacrificial insulating material from the lower cavity and the fourth layer of sacrificial insulating material from the upper cavity, and FIG. 2P is a cross-sectional view of the structure of FIG. 2O after mounting an elongated nano-structure on a surface of the graphene membrane between the upper and lower cavities.

DETAILED DESCRIPTION OF THE PREFERRED EMBODIMENTS

Figure 1:
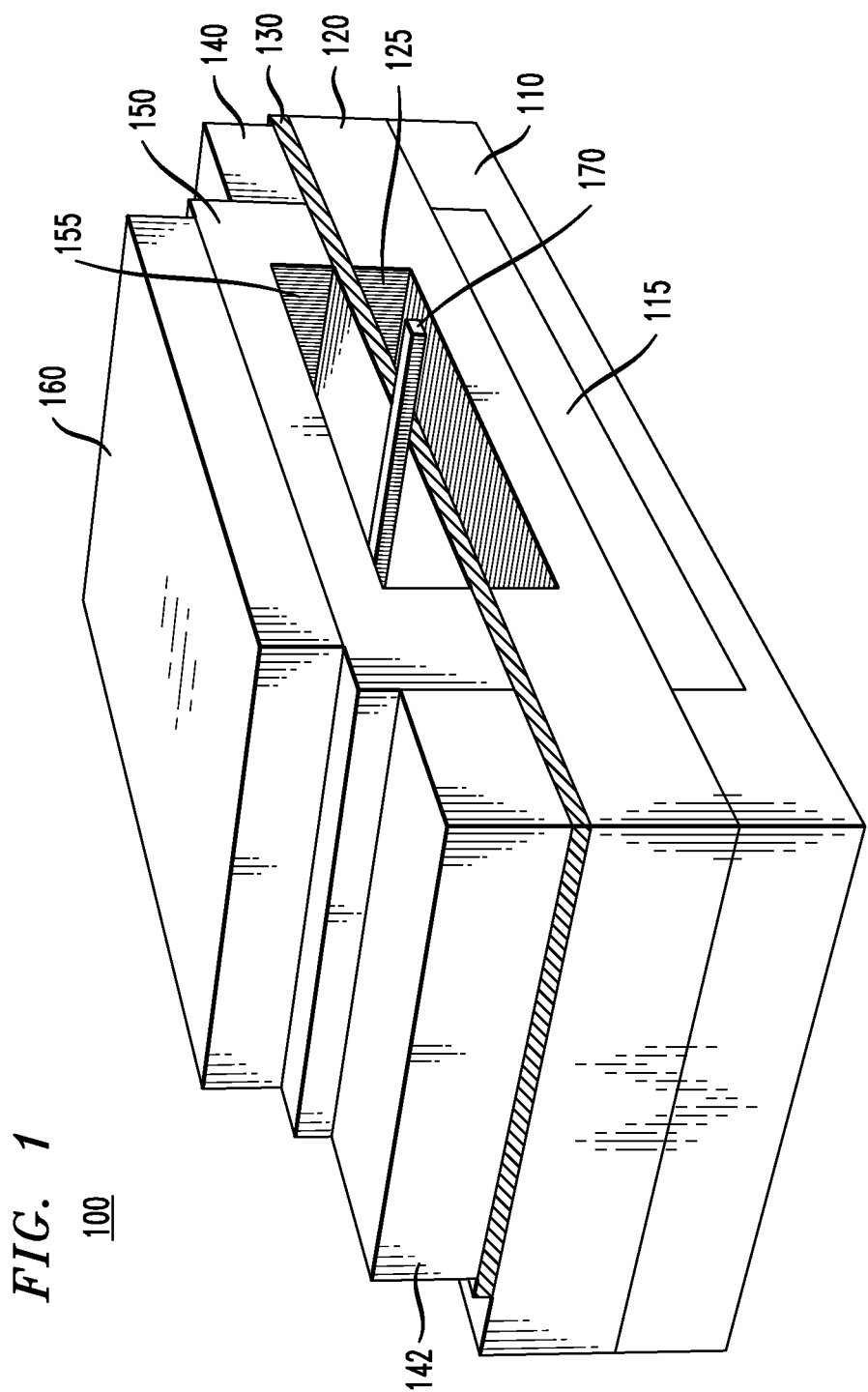
FIG. 1 is a 3-D perspective view of a semiconductor nano-device, according to an aspect of the invention.

Preferred embodiments of the invention will now be described in further detail with reference to semiconductor nano-devices, such as nano-probe and nano-knife devices, which are constructed using electro-mechanical membranes made of graphene. For example, FIG. 1 is a 3-D perspective view of a semiconductor nano-device, according to an aspect of the invention. In general, a semiconductor nano-device 100 comprises a bulk substrate 110, a first gate electrode 115 (or bottom gate electrode) that is formed by doping a region of the substrate 110, a first insulating layer 120 having a first cavity 125 (or lower cavity), a graphene membrane 130, a second insulating layer 150 having a second cavity 155 (or upper cavity), a first sense electrode 140, a second sense electrode 142 (wherein the second sense electrode is optional), a second gate electrode 160 (or top gate electrode), and an elongated nano-structure 170 mounted on a region of the graphene membrane 130 that is suspended between the first and second cavities 125 and 155 of the first and second insulating layers 120 and 150, respectively. As depicted in FIG. 1, the first gate electrode 115, the first cavity 125, the second cavity 155, and the second gate electrode 160 are aligned with each other. It is to be understood that when two different elements on different layers are said to be "aligned with" each other, the term "aligned with" means, for example, that the two different elements at least partially overlap or fully overlap each other on the different layers. An exemplary method and materials used for fabricating a semiconductor nano-device such as depicted in FIG. 1 will be discussed in further detail below with reference to FIGS. 2A-2P.

It is to be appreciated that the semiconductor nano-device 100 of FIG. 1 can be used for many applications. For example, in one aspect of the invention, the semiconductor nano-device 100 may be a semiconductor nano-probe device, wherein the elongated nano-structure 170 is a nano-probe that is made of an electrically conducting material (such as silicon, metal, carbon nanotube, etc.) to measure an electrical potential at some point on a target device. In another aspect of the invention, the semiconductor nano-device 100 may be a semiconductor nano-knife device, wherein the elongated nano-structure 170 is a nano-knife having a sharp tip made of metal, silicon or carbon nanotube material, which can be made to move up and down and cut a target specimen.

In general, a semiconductor nano-probe or nano-knife device according to principles of the invention operate by applying a voltage to the bottom gate electrode 115 and/or the top gate electrode 160 so that the portion of the graphene membrane 130 disposed between the lower cavity 125 and upper cavity 155 will move up and down towards the bottom or top gate electrode 115/160. In this regard, the graphene membrane 130 provides desired electro-mechanical properties. In particular, the graphene membrane 130 is conductive so that the free portion of the graphene membrane 130 (disposed between the cavities 125 and 155) will be attracted to voltage that is applied to the top and bottom gate electrodes 160 and 115. Moreover, with regard to mechanical properties, the graphene membrane 130 can be made to have a thickness of as small as one atomic layer while providing the necessary strength to endure being flexed up and down during continued operation of the semiconductor nano-device 100. Indeed, graphene is known to have a breaking strength 200 times greater than steel.

As noted above, in one exemplary mode of operation, the semiconductor nano-device 100 can operate as a nano-knife. In this mode of operation, the first and/or second sense electrodes 140 and 142 can be connected to ground voltage (e.g., $V_s=0$). A voltage can be applied to the top gate electrode 160, which induces an image charge on the graphene membrane 130 such that the portion of the graphene membrane 130 disposed between the cavities 155/125 will be attracted and pulled toward the upper gate electrode 160. In this instance, the elongated nano-knife 170 mounted on the graphene membrane 130 will also move upward. A specimen can then be placed under the tip of the nano-knife, and then a voltage can be removed from the upper gate electrode 160 and applied to the bottom gate electrode 115 to cause the nano-knife to move downwardly with the graphene membrane 130 being electrically attracted to the bottom gate electrode 115. In this manner, by cooperatively scanning the voltages applied to the lower and upper gate electrodes 115 and 160, the nano-knife can be moved up and down due to the flexing up and down of the graphene membrane 130.

In another exemplary mode of operation, the semiconductor nano-device 100 can operate as a nano-probe. In this mode of operation, the tip of the elongated nano-probe 170 is placed in contact with a spot on a target sample and the voltage potential on sense terminal is adjusted so that the current flowing to the sense terminal is zero ($I_s=0$). At this condition, the voltage applied to the sense terminal is equal to the potential of the sample at the contacting spot. In this way the potential of sample at that spot can be detected. To map the potential on other spots of the sample, one could scan the nano-probe up or down by applying the top or bottom gate voltage and measure the potential using the method described above.

Figure 2A:
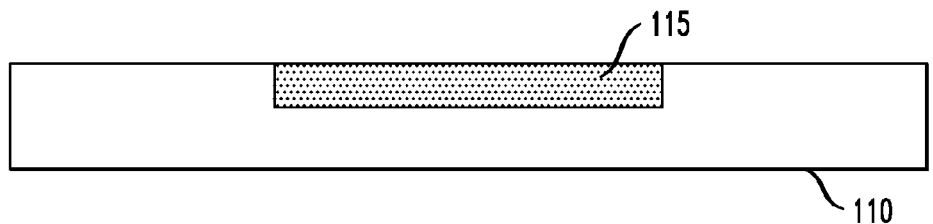

FIGS. 2A, 2B, 2C, 2D, 2E, 2F, 2G, 2H, 2I, 2J, 2K, 2L, 2M, 2N, 2O and 2P schematically illustrate a method for constructing a semiconductor nano-device according to an exemplary embodiment of the invention. In particular, FIGS. 2A, 2B, 2C, 2D, 2E, 2F, 2G, 2H, 2I, 2J, 2K, 2L, 2M, 2N, 2O and 2P are cross-sectional views of a portion of the semiconductor nano-device device 100 of FIG. 1 at various stages of fabrication. Referring initially to FIG. 2A, a cross-sectional view is shown of the semiconductor nano-device 100 at an initial stage of fabrication after doping a region of a semiconductor substrate 110 to form a bottom gate electrode 115. The substrate 110 can be a silicon substrate, an SOI (silicon on insulator) substrate, or the substrate can be formed with any other type of substrate material, or multiple layers of substrate materials, commonly used in VLSI fabrication methods. The bottom gate electrode 115 can be formed using standard lithographic and implant doping techniques to implant dopants such as Boron, Phosphorous or Antimony, or other types of dopants used to form a highly conductive p-doped or n-doped region in a silicon substrate, which serves as the first (bottom) gate electrode 115.

Figure 2B:
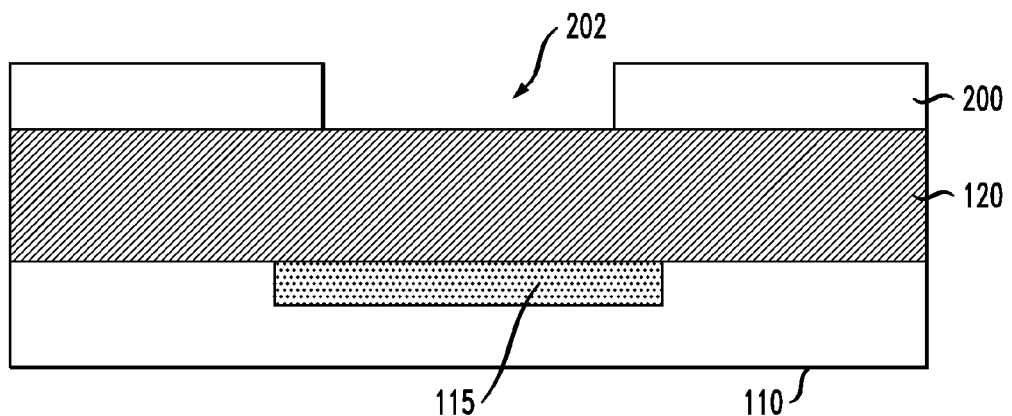

FIG. 2B is a cross-sectional view of the structure of FIG. 2A after forming a first insulating layer 120 over the substrate 110 and forming an etch mask 200 on the first insulting layer 120. The etch mask 200 may be a photoresist mask that is formed using known photolithographic methods. The etch mask 200 includes an opening 202, which is aligned with the first gate electrode 115, which serves to define a cavity to be subsequently etched in the first insulating layer 120 in alignment with the first gate electrode 115. The first insulating layer 120 may be formed using various types of dielectric or insulating materials such as oxides and nitrides, which are commonly used in VLSI fabrication including, but not limited to silicon nitride, silicon oxide, hafnium oxide, zirconium oxide, aluminum oxide, aluminum nitride, boron nitride or a combination of such materials. The first insulating layer 120 may be formed using known deposition techniques. In a preferred embodiment, the thickness of the first insulating layer 120 is in a range of about 0.20 um to about 10.0 um.

Figure 2C:
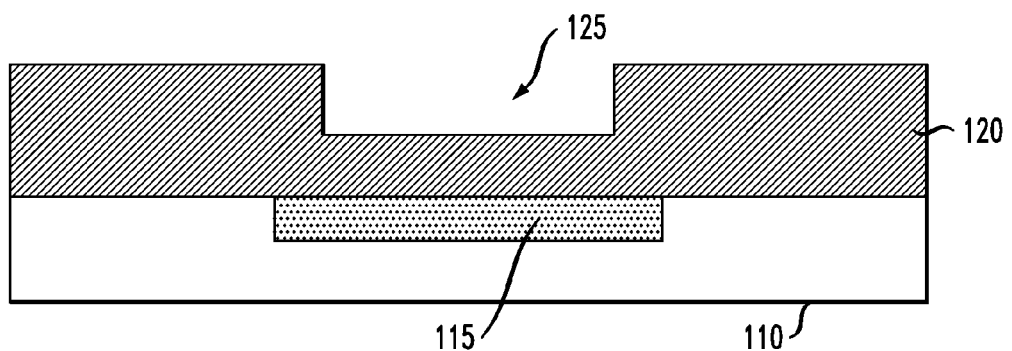

FIG. 2C is a cross-sectional view of the structure of FIG. 2B after etching a cavity 125 in the first insulating layer 120 using the etch mask 200, In this process, an anisotropic dry etch process, such as RIE (reactive ion etching) may be used to etch the portion of the first insulating layer 120 that is exposed through the opening 202 of the etch mask 200 to form the cavity 125. The etching techniques and environments used to etch the first insulating layer 120 will vary depending on what materials are used to form the first insulating layer 120. The cavity 125 may be formed having a width in a range of about 0.10 um to about 4.0 um, and be etched to a depth in a range of about 0.05 um to about 3.0 um.

Figure 2D:
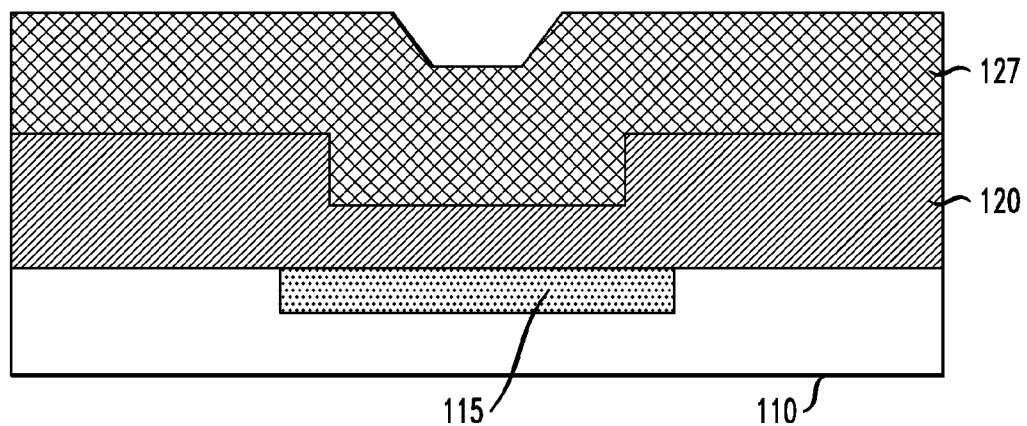

FIG. 2D is a cross-sectional view of the structure of FIG. 2C after depositing a second layer of insulting material 127 to fill the cavity 125 and cover the first layer of insulting material 120. In this process, the second layer 127 of insulting material is used as a sacrificial material to temporarily fill the cavity 125 and provide a surface upon which to deposit a graphene layer. In a preferred embodiment, the second layer of insulating material 127 is farmed with any dielectric or insulating material that has a high etch selectivity to the material forming the first layer of insulating material 120. For example, the second layer of insulating material may be formed by depositing silicon oxide using known deposition techniques.

Figure 2E:
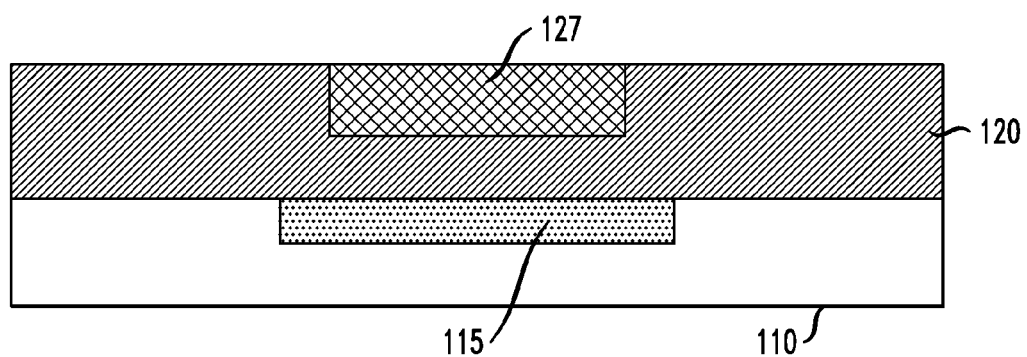

FIG. 2E is a cross-sectional view of the structure of FIG. 2D after planarizing the structure down to the first layer of insulating material 120. As shown in FIG. 2E, the surface is planarized to remove that portion of the second layer of insulating material 127 on top of the first layer of insulating material 120. The planarizing process may be implemented using any suitable CMP (chemical mechanical polishing) process to polish down the second layer of insulating material 127 (e.g., silicon oxide) using the first layer of insulating material 120 (e.g., silicon nitride) as an etch stop for the CMP process. As shown in FIG. 2E, the result of the CMP process is a planarized surface, with the remaining portion of the second layer of insulating material 127 filling the cavity 125 formed in the first layer of insulating material 120.

Figure 2F:
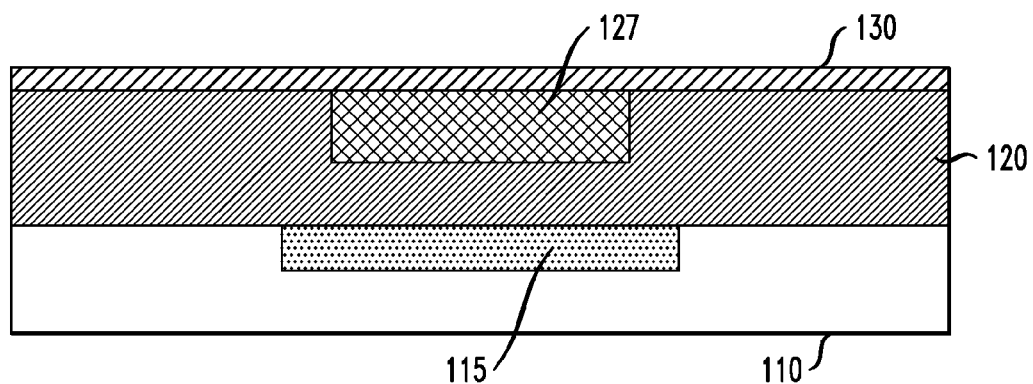

FIG. 2F is a cross sectional view of the structure of FIG. 2E after depositing a graphene membrane 130 over the planarized surface including the first insulating layer 120 and second insulator layer 127. In one preferred embodiment, the graphene membrane 130 is formed on a separate substrate and transferred onto the planarized surface using any known technique that is suitable for the given application. For instance, in one standard method, a thin graphene film can be grown by chemical vapor deposition on copper foil. Then a thin film of poly (methyl methacrylate) (PMMA) is spun onto the graphene surface. Then the PMMA/graphene/copper stack is soaked in a copper etchant to remove copper. The PMMA/graphene film can then be transferred to the target substrate. The PMMA can then be removed by using acetone. The result of this process is the formation of the graphene membrane 130 on the planarized surface, whereby the graphene membrane 130 will sufficiently adhere to the planarized surface via Van der Waals interaction forces.

Figure 2G:
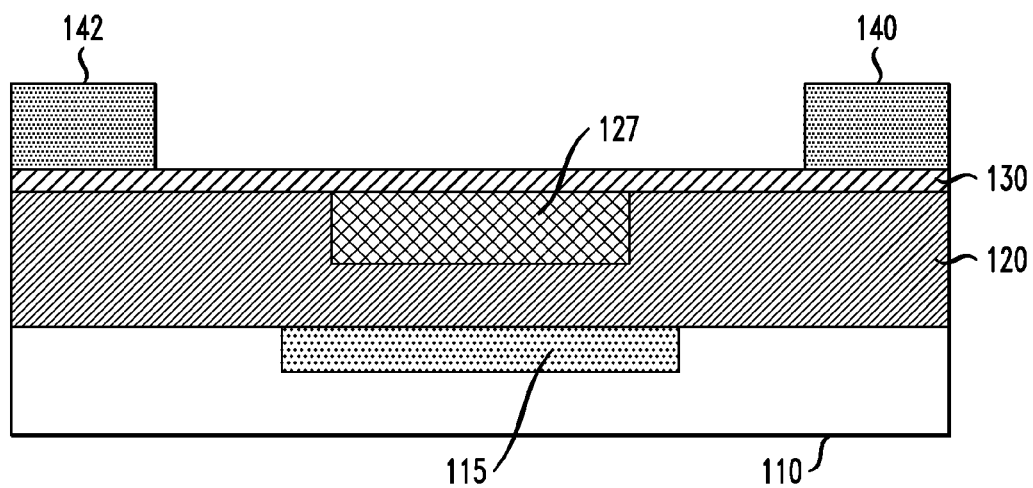

FIG. 2G is a cross-sectional view of the structure of FIG. 2F after forming sense electrodes 140/142 on the graphene membrane 130. The sense electrodes 140/142 can be formed of conductive materials including, but not limited to, titanium, palladium, gold, aluminum, poly silicon, TiN, TaN, tungsten, or a stack of one or more of such materials. For instance, the sense electrodes 140/142 can be formed with a first seed layer of Ti (about 1 nm thick), a second layer of Pd (about 20-30 nm thick) and a third layer of gold. The seed layer is formed of Ti or any suitable material which has good adhesion on the graphene layer 130. The second layer is formed of any suitable material such as Pd that serves to match the work function of the graphene layer 130. Preferably, the overall thickness of the sense electrodes 140, 142 is in a range of about 0.03 um to about 2.0 um. The sense electrodes may be deposited by using any known technique, such as ebeam, sputtering, chemical vapor deposition etc., then patterned by reactive ion etch (RIE) or a "lift-off" process.

Figure 2H:
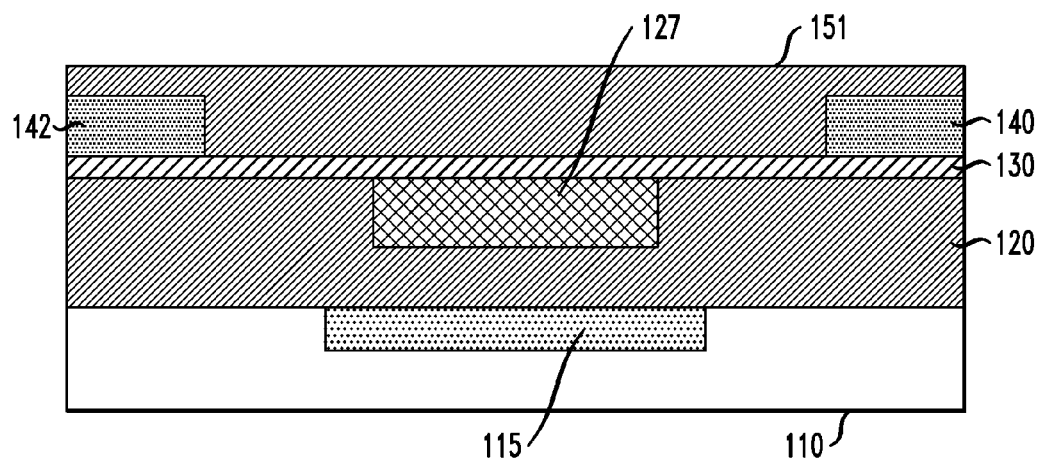

FIG. 2H is a cross-sectional view of the structure of FIG. 2G after forming a third layer of insulating material 151 over the graphene membrane 130 and sense electrodes 140, 142. The third layer of insulating material 151 may be any suitable dielectric or insulating material, such as silicon nitride, silicon oxide, hafnium oxide, zirconium oxide, aluminum oxide, aluminum nitride, boron nitride or a combination of such materials. In a preferred embodiment, the third layer of insulating material 151 is formed of silicon nitride, as silicon nitride will properly adhere to the hydrophobic surface of the graphene membrane 130.

Figure 2I:
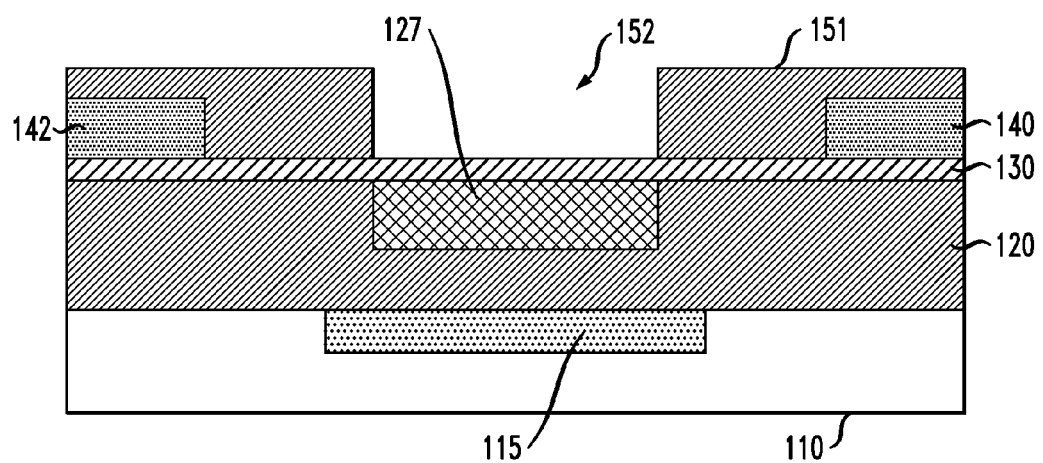

FIG. 2I is a cross-sectional view of the structure of FIG. 2H after etching a cavity 152 in the third layer of insulating material 151, wherein the cavity 152 is aligned with the underlying cavity 125 (that is filled with sacrificial material 127) in the first insulating layer 120. The cavity 152 can be formed using standard photolithographic techniques as discussed above with regard to forming the underlying cavity 125. For example, an etch mask is first formed over the third layer of insulating material 151 having an opening that defines a width of the cavity 152 in alignment with the width of the underlying cavity 125. Then, an etch process is performed to etch a portion of the third layer of insulating material 151 which is exposed through the defined opening in the etch mask to form the cavity 152.

Figure 2J:
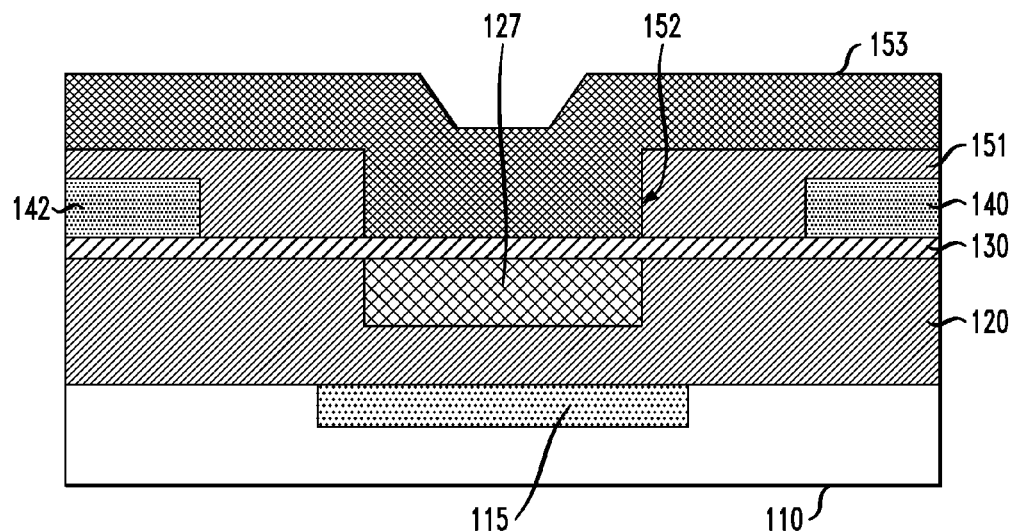

FIG. 2J is a cross-sectional view of the structure of FIG. 2I after depositing a fourth layer of insulting material 153 to fill the cavity 152 and cover the third layer of insulting material 151. In this process, the fourth layer of insulting material 153 is used as a sacrificial material to temporarily fill the cavity 152 and provide a surface upon which to form a fifth layer of insulting material. In a preferred embodiment, the fourth layer of insulating material 153 is formed with any dielectric or insulating material that has a high etch selectivity to the material forming the third layer of insulating material 151. For example, the fourth layer of insulating material 153 may be fanned by depositing silicon oxide using known deposition techniques.

Figure 2K:
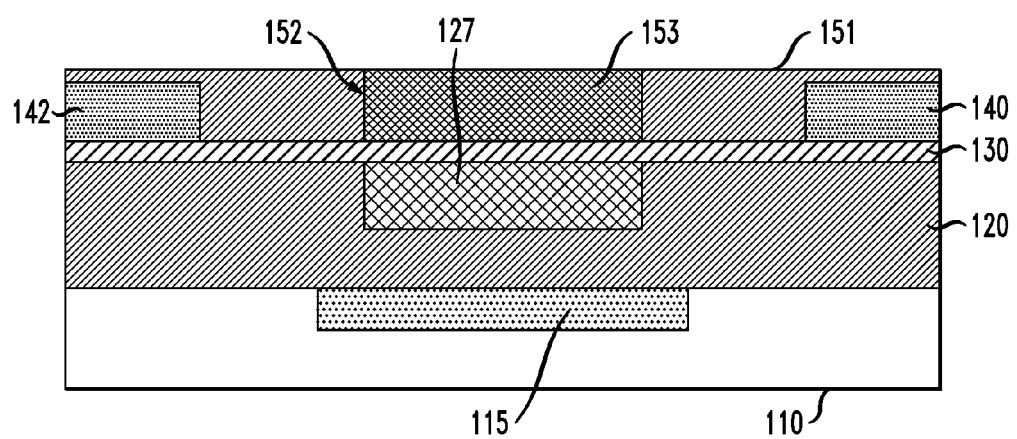

FIG. 2K is a cross-sectional view of the structure of FIG. 2J after planarizing the structure down to the third layer of insulating material 151. As shown in FIG. 2K, the surface of the substrate is planarized to remove the portion of the fourth layer of insulating material 153 on top of the third layer of insulating material 151. The planarizing process may be implemented using any suitable CMP (chemical mechanical polishing) process to polish down the fourth layer of insulating material 153 (e.g., silicon oxide) using the third layer of insulating material 151 (e.g., silicon nitride) as an etch stop for the CMP process. As shown in FIG. 2K, the result of the CMP process is a planarized surface, with the remaining portion of the fourth layer of insulating material 153 filling the cavity 152.

Figure 2L:
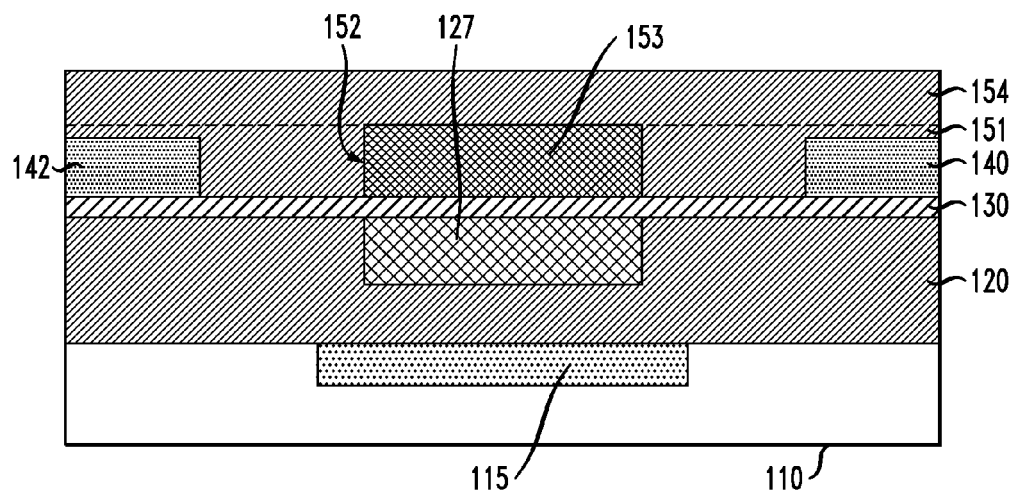

FIG. 2L is a cross-sectional view of the structure of FIG. 2K after depositing a fifth layer of insulating material 154 over the planarized substrate surface. In a preferred embodiment, the fifth layer of insulating material 154 is preferably the same or similar material forming the third layer of insulating material 151. For instance, both layers of insulating material 151 and 154 may be formed of silicon nitride. In a preferred embodiment, the fifth layer of insulating material 154 is formed of a dielectric or insulating material that has etch selectivity with respect to the sacrificial insulating material 153 filling the cavity 152, so that the sacrificial insulating material 153 within the cavity 152 can be etched selectively to the materials forming the third and fifth layers of insulating material 151 and 154.

Figure 2M:
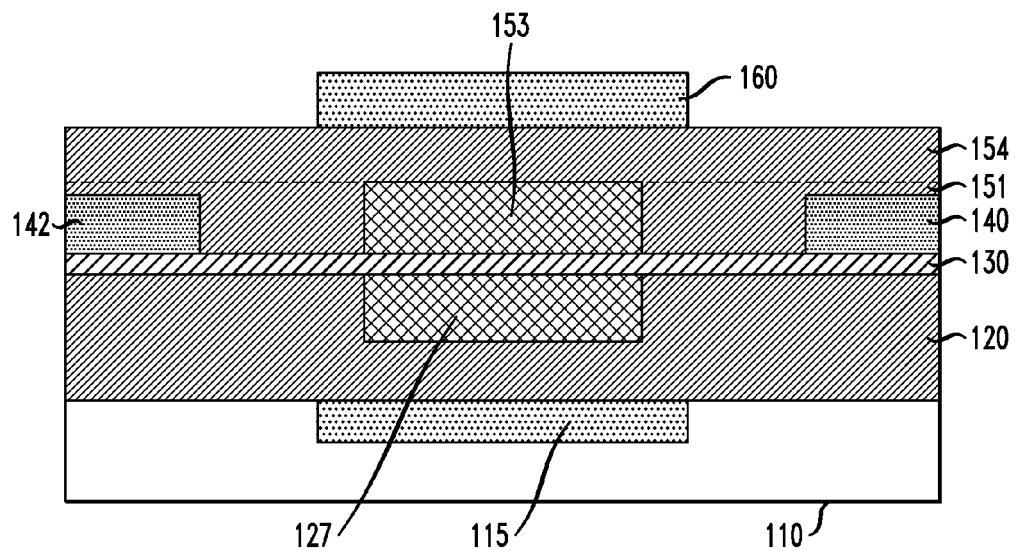

FIG. 2M is a cross-sectional view of the structure of FIG. 2L after forming a top gate electrode 160 on top of the fifth layer of insulating material 154. The top gate electrode 160 can be formed of conductive materials including, but not limited to, titanium, palladium, gold, aluminum, poly silicon, TiN, TaN, tungsten, or a stack of one or more of such materials. The overall thickness of the second gate electrode 160 is in a range of about 0.03 um to about 2.0 um. The top gate electrode 160 may be formed using any known technique, such as depositing one or more layers of metallic material, and performing an anisotropic etch process or a "lift-off" process to define and form the top gate electrode 160. As shown in FIG. 2M, the top gate electrode 160 is formed in alignment with the filled cavities 153 and 127 and the bottom gate electrode 115 formed in the substrate 110.

Figure 2N:
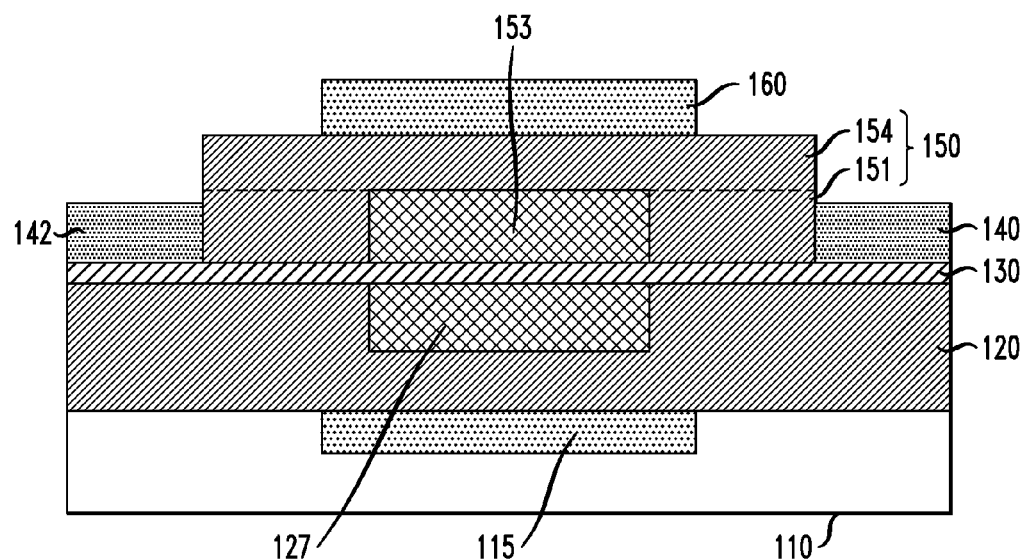

FIG. 2N is a cross-sectional view of the structure of FIG. 2M after etching portions of the fifth and third layers of insulating material 154 and 151, to expose the sense electrodes 140/142 on either side of the top gate electrode 160. In one preferred embodiment, this process is performed by forming an etch mask over the substrate surface having openings that expose those portions of the fifth and third layers of insulating material 154 and 151 formed over the first and second sense electrodes 140 and 142, and then performing an etch process to remove the exposed portions of the fifth and third layers of insulating material 154 and 151 down to the top of the first and second sense electrodes 140 and 142. As shown in FIG. 2M, the remaining portions of the etched fifth and third layers of insulating material 154 and 151 form the structure of the insulating layer 150 (as shown in FIG. 1).

Figure 2O:
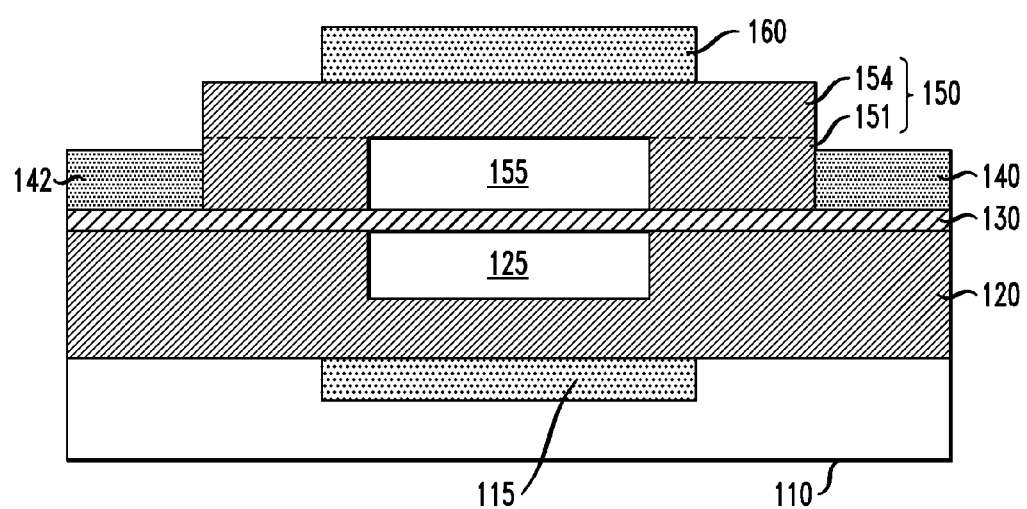

FIG. 2O is a cross-sectional view of the structure of FIG. 2N after dicing the substrate to form an individual semiconductor nano-structure, removing the remaining portion of the second layer of insulating material 127 from the lower cavity 125 and the remaining of fourth layer of insulating material 153 from the upper cavity 152. As shown in FIG. 2O, removing the sacrificial insulating material 127 in the cavity 125 results in the open lower cavity 125 having top surface defined by the graphene membrane 130, the bottom and sidewall surfaces defined by the first layer of insulating material 120. As shown in FIG. 2O, removing the sacrificial insulating material 153 in the cavity 152 results in the open upper cavity 155 having top and bottom surfaces defined by the fifth layer of insulating material 154 and the graphene membrane 130, respectively, and sidewall surfaces defined by the third layer of insulating material 151. The cavities may be formed having a width in a range of about 0.10 um to about 4.0 um, and be etched to a depth in a range of about 0.05 um to about 3.0 um.

Figure 2P:
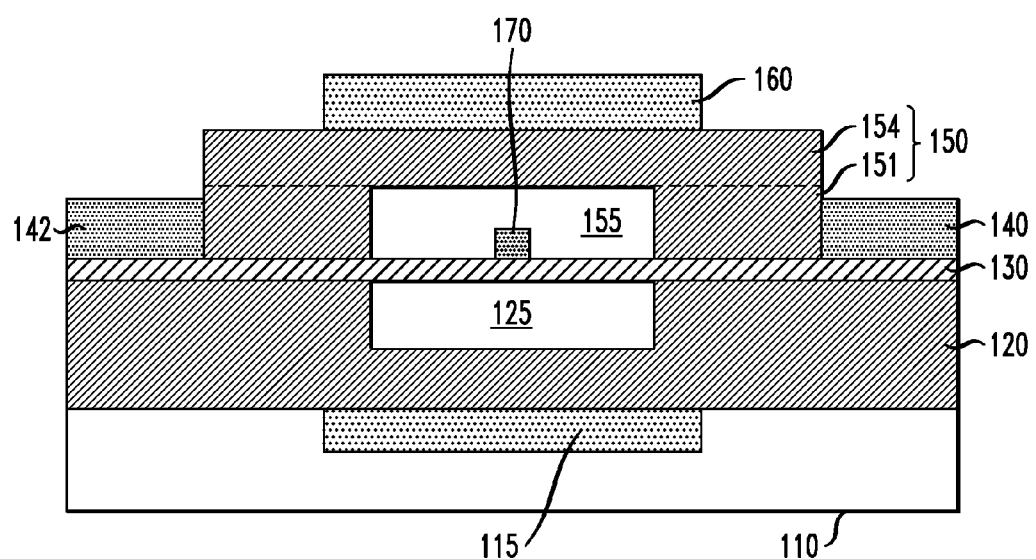

FIG. 2P is a cross-sectional view of the structure of FIG. 2O after mounting an elongated nano-structure 170 on a surface of the graphene membrane 130 between the upper and lower open cavities 155 and 125. As noted above, the elongated nano-structure 170 may be a nano-knife or a nano-probe structure that is formed of a material such as silicon, metal, carbon nanotube, etc. The surface of graphene 130 can be coated with protecting layers such as polymers.

It is to be understood that the invention is not limited to the particular materials, features, and processing steps shown and described herein. Modifications to the illustrative embodiments will become apparent to those of ordinary skill in the art. It should also be understood that the various layers and/or regions shown in the accompanying figures are not drawn to scale, and that one or more semiconductor layers and/or regions of a type commonly used in such integrated circuits may not be explicitly shown in a given figure for ease of explanation. Particularly with respect to processing steps, it is to be emphasized that the descriptions provided herein are not intended to encompass all of the processing steps that may be required to form a functional integrated semiconductor nano-device. Rather, certain processing steps that are commonly used in forming semiconductor devices, such as, for example, wet cleaning and annealing steps, are purposefully not described herein for economy of description. However, one of ordinary skill in the art will readily recognize those processing steps omitted from these generalized descriptions.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:
1. A semiconductor device, comprising:
   a bottom gate electrode;
   a first insulating layer disposed over the bottom gate electrode, the first insulating layer comprising a first open cavity etched in the first insulating layer, wherein the first open cavity is aligned with the bottom gate electrode;
   a second insulating layer disposed over the first insulating layer, the second insulating layer comprising a second open cavity etched in the second insulating layer, wherein the second open cavity is aligned with the first open cavity;

a graphene layer disposed between the first and second insulating layers and in contact with surfaces of the first and second insulating layers, wherein a portion of the graphene layer is suspended between the first and second open cavities;

at least one sense electrode disposed on the graphene layer adjacent the first and second open cavities, an elongated nano-structure mounted to the portion of the graphene layer that is suspended between the first and second open cavities; and a top gate electrode disposed over the second insulating layer, the top gate electrode aligned with the bottom gate electrode and the first and second open cavities.

2. The semiconductor device of claim 1, wherein the bottom gate electrode is a conductive doped region formed in a semiconductor substrate.

3. The semiconductor device, of claim 1, wherein the elongated nano-structure is a nano-knife structure.

4. The semiconductor device of claim 1, wherein the elongated nano structure is a nano-probe structure.

5. The semiconductor device of claim 1, wherein the at least one sense electrode comprises a first sense electrode and a second sense electrode in contact with the graphene layer, wherein the first and second sense electrodes are disposed on opposing sides of the first and second open cavities.

6. The semiconductor device of claim 1, wherein the first and second cavities have a width in a range of about 0.10 um to about 4.0 um, and a depth in a range of about 0.05 um to about 3.0 um.

7. The semiconductor device of claim 1, wherein the elongated nano structure is formed of silicon.

8. The semiconductor device of claim 1, wherein the elongated nano-structure is formed of a metallic material.

9. The semiconductor device of claim 1, wherein the elongated nano structure is formed of a carbon nanotube structure.

10. The semiconductor device of claim 1, wherein the bottom gate electrode, the first open cavity, the second open cavity, and the top gate electrode at least partially overlap each other.

* * * * *